United States Patent [19]

MacNak et al.

[11] Patent Number: 4,817,196
[45] Date of Patent: Mar. 28, 1989

[54] APPARATUS FOR TUNING THE ANTENNA OF A MINIATURE PERSONAL COMMUNICATIONS DEVICE

[75] Inventors: Philip P. MacNak, West Palm Beach; James S. Irwin, Ft. Lauderdale, both of Fla.

[73] Assignee: Motorola, Inc., Schaumburg, Ill.

[21] Appl. No.: 74,426

[22] PCT Filed: Jan. 2, 1987

[86] PCT No.: PCT/US87/00001

§ 371 Date: Mar. 13, 1987

§ 102(e) Date: Mar. 13, 1987

[51] Int. Cl.[4] .................... H01Q 1/12; H03J 3/14; H04B 1/18

[52] U.S. Cl. .................... 455/193; 455/158; 455/159; 343/718

[58] Field of Search ........ 455/351, 344, 193, 154–158; 343/718

[56] References Cited

U.S. PATENT DOCUMENTS

| | | | |
|---|---|---|---|
| 2,255,897 | 9/1941 | Rebori et al. | 343/718 |
| 3,526,838 | 9/1970 | Banick | 455/155 X |
| 3,736,591 | 5/1973 | Rennels et al. | 455/193 X |
| 4,017,748 | 4/1977 | Davis | 455/228 X |
| 4,419,770 | 12/1983 | Yagi et al. | 455/351 X |
| 4,713,808 | 12/1987 | Gaskill et al. | 370/93 X |

FOREIGN PATENT DOCUMENTS

| | | | |
|---|---|---|---|
| 0100639 | 2/1984 | European Pat. Off. | 343/718 |
| 0184606 | 6/1986 | European Pat. Off. | |
| 53-101210 | 4/1978 | Japan. | |
| 2101436 | 1/1983 | United Kingdom. | |
| 2163297 | 2/1986 | United Kingdom. | |

*Primary Examiner*—Theodore M. Blum
*Assistant Examiner*—Gilberto Barrón, Jr.
*Attorney, Agent, or Firm*—Vincent B. Ingrassia; Anthony J. Sarli, Jr.; Donald B. Southard

[57] ABSTRACT

An antenna tuning arrangement is provided for a miniature personal communications device which is normally worn on the body. The device includes a wristband having an antenna and antenna tuning elements which are normally concealed, to allow the antenna to be tuned while the device is being worn. A receiver in the communications device is coupled to the antenna and to a tuning indicator circuit which provides a tuning indication when the tuning element is adjusted without requiring entry into the device. The tuning indicator operation is selectable and draws no power when not selected.

19 Claims, 9 Drawing Sheets

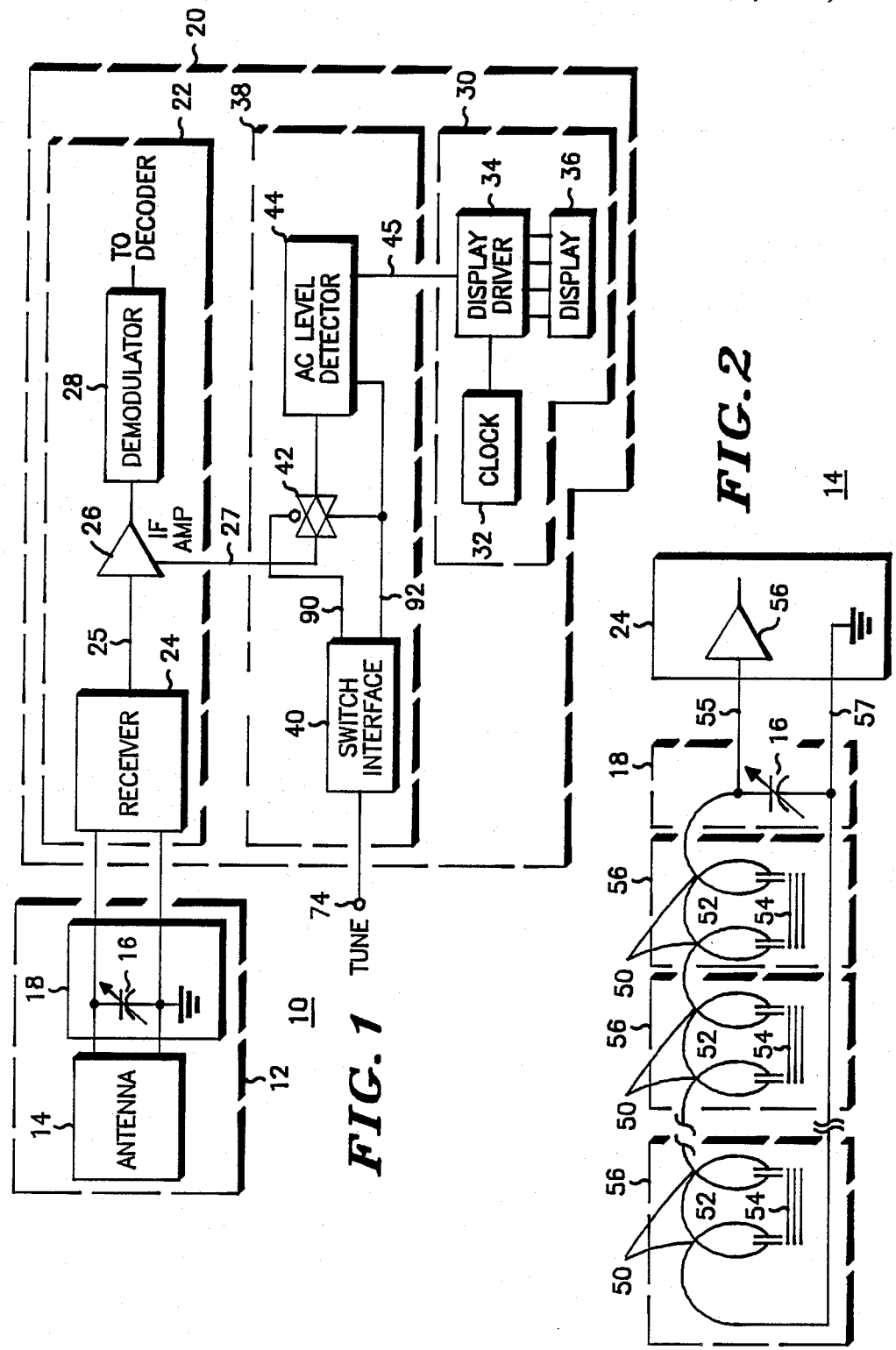

NORMAL DISPLAY

DISPLAY WITH TUNING INDICATOR

DISPLAY WITH BAR TUNING INDICATOR

DISPLAY WITH NUMERIC TUNING INDICATOR

APPARATUS FOR TUNING THE ANTENNA OF A MINIATURE PERSONAL COMMUNICATIONS DEVICE

FIELD OF THE INVENTION

This invention relates to the field of antennas for miniature personal communications devices. More particularly, the invention relates to an apparatus for tuning an antenna located in the means adapting the device to be worn on the body, such as in a wristband, bracelet, or necklace, and a method of tuning the antenna while the device is worn.

BACKGROUND OF THE INVENTION

There are many miniature personal electronic devices available today adapted to be worn on the body and providing a variety of features and functions to the wearer. Examples of such devices include watches, calculators, miniature broadcast receivers, and even miniaturized personal body function monitoring devices. These miniature personal electronic devices are available in a variety of forms, such as wristworn devices, as watches, and devices which are clipped or hung on the body, as pendants or broaches. Many of these devices include receiver functions requiring an antenna to be incorporated in the design of the device, thereby providing a miniature personal communications device. Various methods of incorporating the antenna into these prior art miniature personal communications devices have been proposed. The antenna has variously been located in the wristband of the device, externally connected to the case of the device, or included within the case of the device. In each instance, tuning of the prior art device antennas has been achieved by tuning elements located in the case of the device which can only be accessed by opening the case of the device.

In addition to having to enter the case for access to modify the antenna tuning elements, prior art devices also require access into the case to access the test or metering point providing the indication that the antenna is being tuned. Without access to the metering point, tuning of the antenna and subsequently the receiver itself, is impossible.

Most antennas, including those provided in prior art devices are generally detuned, when they are brought into close proximity to the body. Thus, prior art tuning methods which are internally performed and require access into the device case, do not optimize the "on the body" antenna sensitivity. Optimum antenna performance can only be achieved when the device is tuned in situ, on the person who is to wear the device.

Several problems are specifically encountered when incorporating the antenna into the means adapting the device to be worn on the body, such as a wristband. First, the size of the person's wrist causes large variations in antenna sensitivity compared with that achieved during initial tuning. Also, most wristbands, because of the flexing, twisting and general abuse they receive during normal wear and through daily removal and replacement, result in periodic replacement of the wristband. The requirement to enter the case for wristband replacement and retuning makes this task both time consuming and expensive. Also, variations in the manufacturing process required to make an antenna suitably located in a wristband results in wider variations of electrical characteristics than would ordinarily be encountered in conventional internally located antennas. These and other problems associated with the prior art designs are overcome by the use of the invention described in detail herein.

SUMMARY OF THE INVENTION

It is an object of the present invention to provide a means of tuning the antenna of a miniature personal communications device which does not require intrusion into the housing of the device.

It is a further object of the present invention to provide a means of tuning the antenna of a miniature personal communications device that may be accomplished while the device is being worn.

It is a further object of the present invention to provide a means whereby the antenna of a miniature personal communications device may be replaced and retuned without intrusion into the housing of the device.

It is a further object of the present invention to provide a means of tuning the antenna of a miniature personal communications device which does not require access to metering or test points within the housing.

It is a further object of the present invention to provide a means of tuning the antenna of a miniature personal communications device which draws no power from the battery when the device is not being tuned.

In general, an antenna tuning arrangement for a miniature personal communications device is provided. The antenna and antenna tuning element are located within the attachment device which secures the device to the body. The antenna couples to the device receiver which is further coupled to a tuning indicator circuit. Tuning of the antenna can be monitored while the device is being worn, and without entry into the housing of the device. Operation of the tuning indicator is selectable and draws no power when not selected.

In particular, an antenna tuning arrangement for a miniature personal communications device including a watch is provided. The antenna and antenna tuning element are located within the wristband of the device which secures the device to the body. The antenna couples to the device receiver which is further coupled to a tuning indicator circuit. Tuning of the antenna can be monitored on the display normally used to display the time while the device is being worn, and without entry into the housing of the device. Operation of the tuning indicator is selectable and draws no power when not selected.

These and other objects and advantages of the present invention will become apparent to those skilled in the art upon consideration of the following description and accompanying drawings of the invention.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference numerals identify identical elements, and wherein:

FIG. 1 is a functional block diagram of the preferred embodiment of the present invention.

FIG. 2 is an electrical schematic diagram of a wristband antenna constructed in accordance with the present invention.

DESCRIPTION OF THE PREFERRED EMBODIMENT

Figure 3:
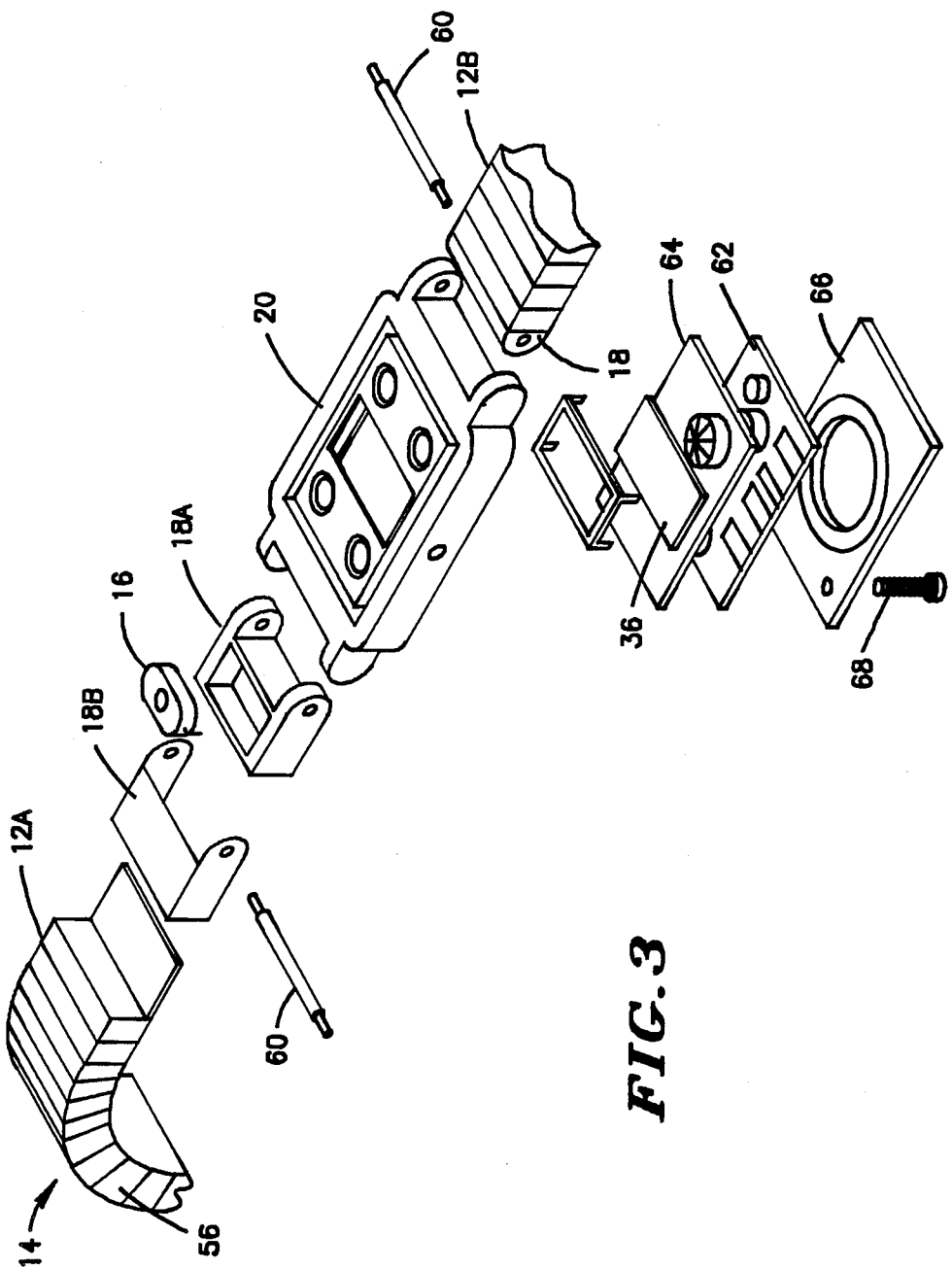
FIG. 3 is an exploded view of the mechanical arrangement for the preferred embodiment of the present invention.

Reference is now directed to the drawings, and in particular to FIG. 1, which represents a functional block diagram for a device 10 constructed in accordance with the present invention. Device 10 represents one of the many forms of miniature personal communications devices which may be constructed in accordance with the present invention and which incorporates the antenna to be advantageously located in the attachment portion adapted for wearing the device on the body. One example for device 10 is a device capable of being worn on the wrist, such as a pager-watch, consisting of a wristband 12 and a housing or case 20, the configuration of which Will be described in detail with FIG. 3. Within the attachment portion, which in this case is a wristband 12, there is located an antenna 14, and an element to tune the antenna, shown as a variable capacitor 16. The tuning element, or capacitor 16, is shown to be contained in a section 18 of wristband 12 which provides concealment and protection, the function of which will become more obvious when the configuration of section 18 is described in detail in FIG. 3.

Within case 20, as shown in FIG. 1, is located a communications receiver 22, only a portion of which is shown to describe the present invention. It will be appreciated by those skilled in the art, that other well known circuit functions, such as a decoder and audio circuits, would also be part of a full description of communications receiver 22. Communications receiver 22 may be used to receive intelligence, such as commercial radio programming, or to provide other forms of communications, such as a selective call paging receiver, each of which is well known by persons skilled in the art. Within communications receiver 22 is shown a receiver portion 24 which is coupled to antenna 14 and tuning element 16 providing for reception of a transmitted RF carrier signal in a manner well known to one skilled in the art, and providing at the output an intermediate, or IF signal 25. The IF signal 25 is amplified by IF amplifier 26 to a level sufficient to drive a demodulator 28, coupled to the IF amplifier 26 output.

As will be appreciated by one skilled in the art, the level of the signal provided at the output of the IF amplifier 26 is in limiting in the case of an FM communications receiver and such a limited signal cannot be used to monitor tuning of the antenna and receiver sections. A signal which varies linearly as the antenna and receiver sections are tuned is needed to monitor the tuning process, and is obtained by taking an intermediate tuning, or meter point, output 27 from the IF amplifier which has not been amplified as extensively as the signal at the output of the IF amplifier.

As further shown in FIG. 1, although it does not comprise part of this invention, case 20 houses an electronic timekeeping or watch circuit 30 consisting of a watch, or clock circuit 32 coupled to a display driver circuit 34 which drives a display 36. The operation of the electronic watch circuit 30 is well known to one skilled in the art. Switches are provided for controlling the watch functions, and are also provided for control of the receiver functions, but are not shown in FIG. 1 for the sake of clarity.

As further shown in FIG. 1, case 20 also houses a tuning indicator circuit 38 consisting of a switch interface 40 used to select or enable tuning indicator circuit 38 operation when switch 74 (not shown in detail in FIG. 1) which is located in case 20 is actuated. The output of switch interface 40 couples to an electronic switch 42 which isolates tuning indicator circuit 38 from IF amplifier 26 when tuning indicator circuit 38 is not in use. The output of electronic switch 42 couples the meter point signal 27 to AC level detector circuit 44. A second output of switch interface 40 also couples to level detector circuit 44 controlling power supplied to level detector circuit 44 as will be described in detail later.

Level detector circuit 44 provides a detection output signal 45 when meter point signal 27 exceeds a predetermined threshold voltage. Detection output signal 45 is coupled to display driver 34 and results in a predetermined area or segment of the display to illuminate, as would be the case with an LED display, or darken, as would be the case with an LCD display, thereby indicating the threshold voltage has been exceeded. An example of one implementation of such a display is shown in FIG. 9B, to be described in detail later. The procedure for tuning antenna 14 using tuning indicator circuit 38, as described above, will be fully described later.

Reference is now directed to FIG. 2 which shows the preferred embodiment of antenna 14 constructed in the attachment portion of the device, such as a wristband, suitable for use with a miniature personal communications device. Only a brief description of antenna 14 will be given, as a detailed description of its construction and operation may be found in U.S. Pat. No. 3,946,397 to Irwin, entitled "Inductor Antenna Arrangement with Integral Series Resonating Capacitors" which is assigned to the assignee of the present invention, and which is hereby incorporated for reference.

In the preferred embodiment of antenna 14 shown in FIG. 2 and constructed for wrist attachment, antenna 14 is composed of a number of sections or links 56 fashioned using a ferromagnetic material core 54, such as ferrite. Two turns 50 of a conductive material, such as flat copper wire, are wound on core 54, the windings being interspersed with two fixed capacitors 52 which are generally of equal value. The links 56 are interconnected on a flexible substrate to form a multi-turn loop antenna which connects to tuning element 16. A protective cover, such as silicon rubber or other suitable material, may be molded over the links 56 to provide environmental protection. Link 18 which protects and conceals tuning element 16 may be molded as part of the wristband. One output 55 from antenna 14 is coupled into case 20 to the input of RF amplifier 56 which, as will be appreciated by one skilled in the art, is usually the first stage of a communications receiver. The second output 57 is coupled into case 20 and provides the signal ground in a fashion also well known to one skilled in the art.

Reference is now directed to FIG. 3 which shows the construction of the preferred embodiment of the present invention suitable for wrist worn devices, such as pager-watches. Spring loaded pins 60 are used to secure wristband 12 to case 20 in a manner well known to one skilled in the art. It will be appreciated by those skilled in the art that interconnection of antenna 14 to receiver 22 which is contained on board 62 may be accomplished in a variety of ways, such as contacts located in the side of case 20 which allow electrical connection through case 20. Tuning element 16 is located in coupling link 18 which consists of a containment section 18A made from a rigid molded material, such as plastic as previously described, and a cover section 18B made from a formable material, such as sheet metal, prepared in a manner to provide a stylish appearance. Cover section 18B normally is closed, concealing tuning element 16. When required to tune antenna 14, cover section 18B may be pried open, exposing tuning element 16. As shown in FIG. 3, housed within case 20 are several circuit boards mounting the components of receiver 22 and tuning indicator 38 on board 62 and watch circuit 30 on board 64. A display 36, such as an LCD display, is connected to board 64 in a fashion well known to one skilled in the art. A cover 66 encloses the various component in case 20, and is secured by a number of screws 68, only one of which is illustrated.

As further shown in FIG. 3, wristband 12 consists of two sections 12A and 12B. As will be appreciated by one skilled in the art, antenna 14 may be constructed into only one section of wristband 12, such as section 12A, although both sections could incorporate antenna elements if additional antenna sensitivity is required.

While FIG. 3 has shown that an antenna may be specifically constructed into a wristband which is normally used to provide attachment to the body, it should be clear that other body attachment devices, such as bracelets, necklaces, chains, and belts may be used for the dual purpose of body attachment and as part of an antenna system as previously described.

Figure 4:
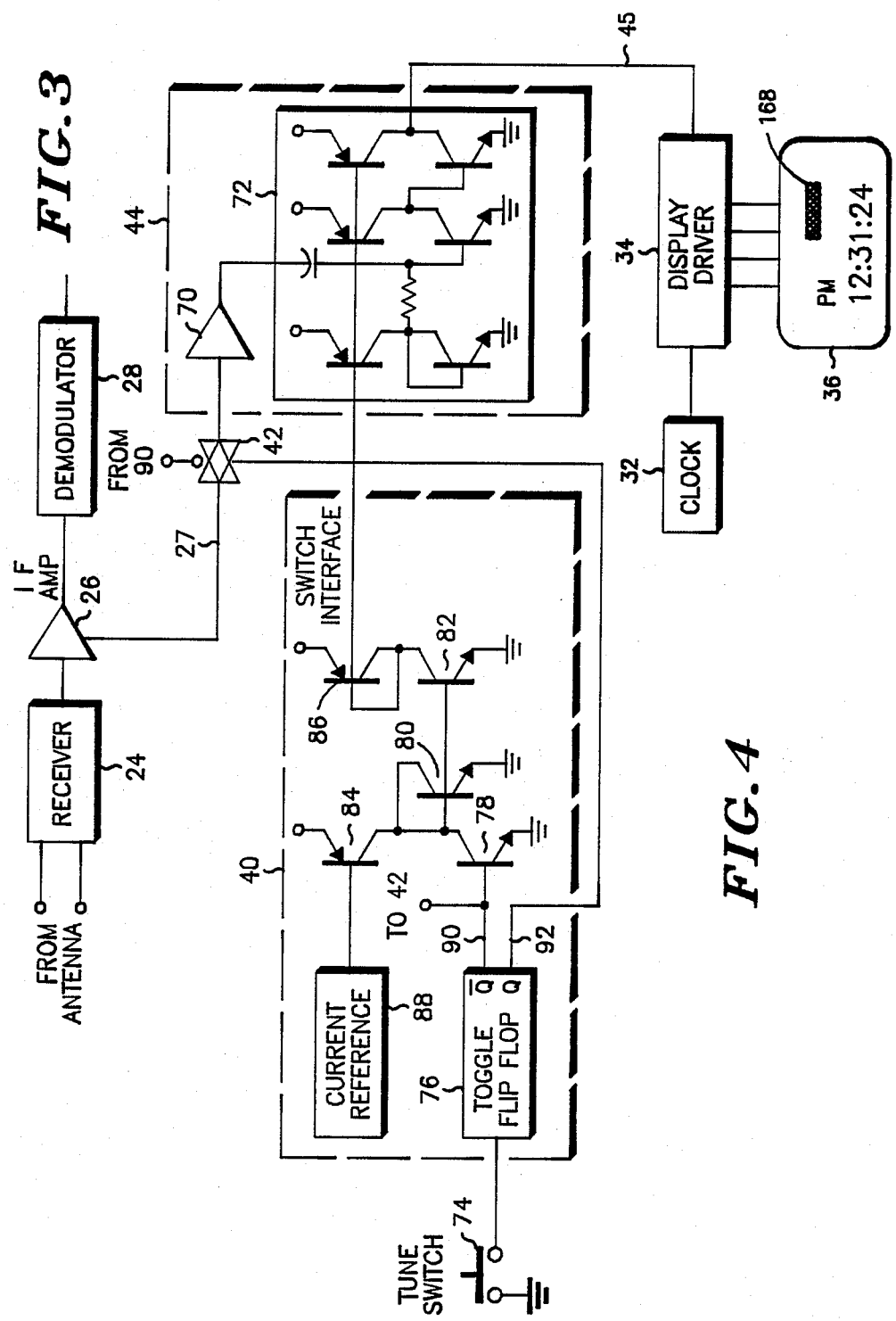
FIG. 4 is a more detailed electrical schematic diagram of the preferred embodiment of the present invention.

Reference is now directed to FIG. 4 which shows a more detailed electrical diagram of the preferred embodiment of the present invention. Switch interface circuit 40 is shown to include a toggle flip flop 76, a current reference 88, and five transistors 78, 80, 82, 84, and 86. Current reference 88, together with transistor 84, which acts as a current mirror, provides a fixed output current at the collector of transistor 84 in a manner well known to one skilled in the art. The collector of transistor 84 connects to the base and collector of diode-connected transistor 80 and the collector of transistor 78. Assuming transistor 78 to be switched off, the collector current of transistor 84 passes through diode-connected transistor 80. The base of transistor 82 is connected to the collector-base of diode-connected transistor 80, forming a current mirror with transistor 80. Thus, transistor 82 collector current is determined by the current delivered by transistor 84 passing through diode-connected transistor 80. The collector of transistor 82 is connected to the collector and base of diode-connected transistor 86, forming current mirrors with the PNP transistors located in level detector 72, thus providing the bias for level detector 72 operation. The operation of level detector 72 is best understood by referring to U.S. Pat. No. 4,017,748 to Davis, entitled "Monolithic AC Level Detector" which is assigned to the assignee of the present invention, the disclosure of which is hereby incorporated for reference. Thus, when transistor 78 is switched off, power is provided to level detector 72 which is then operational.

A switch 74 is coupled to the input of toggle flip flop 76, alternately setting and resetting toggle flip flop 76 each time switch 74 is actuated. When toggle flip flop 76 is reset, Q output terminal 90 is low. The Q output terminal 90 couples to the base of transistor 78, consequently when Q output terminal 90 is low, transistor 78 output will be high or off, activating level detector 72 as previously described. When toggle flip-flop 76 is set, Q output terminal 90 goes high, turning transistor 78 on which sinks transistor 84 collector current, removing the bias to the current mirror formed by transistors 80 and 82, thereby turning off level detector 72.

The Q-bar output terminal 92 of toggle flip-flop 76 is connected to one of the control inputs of CMOS transmission gate 42. The other control inputs connects to Q output terminal 90. When toggle flip-flop 76 is reset, Q-bar output terminal 92 is high and Q output terminal 90 is low, switching CMOS transmission gate 42 into a low impedance state, thereby coupling the meter point signal 27 to the input of amplifier 70. When toggle flip-flop 76 is set, Q-bar output terminal 92 is low and Q output terminal 90 is high, switching CMOS transmission gate 42 into a high impedance state, thereby isolating the meter point signal 27 from the input of amplifier 70 as previously described.

Amplifier 70 is provided to boost meter point signal 27 by an amount, such as 30 dB, which is sufficient to allow operation of level detector 72, while maintaining meter point signal 27 to be in a linear range, such as around -30 dBm, when antenna 14 is being tuned. The output of amplifier 70 is coupled to the input of level detector 72, and when the input exceeds the threshold value to which level detector 72 is set, the output 45 of level detector 72 goes high. The output of level detector 72 is connected to display driver 34, causing an indication on display 36 that the threshold has been exceeded, and that antenna 14 is tuning.

Figure 5:
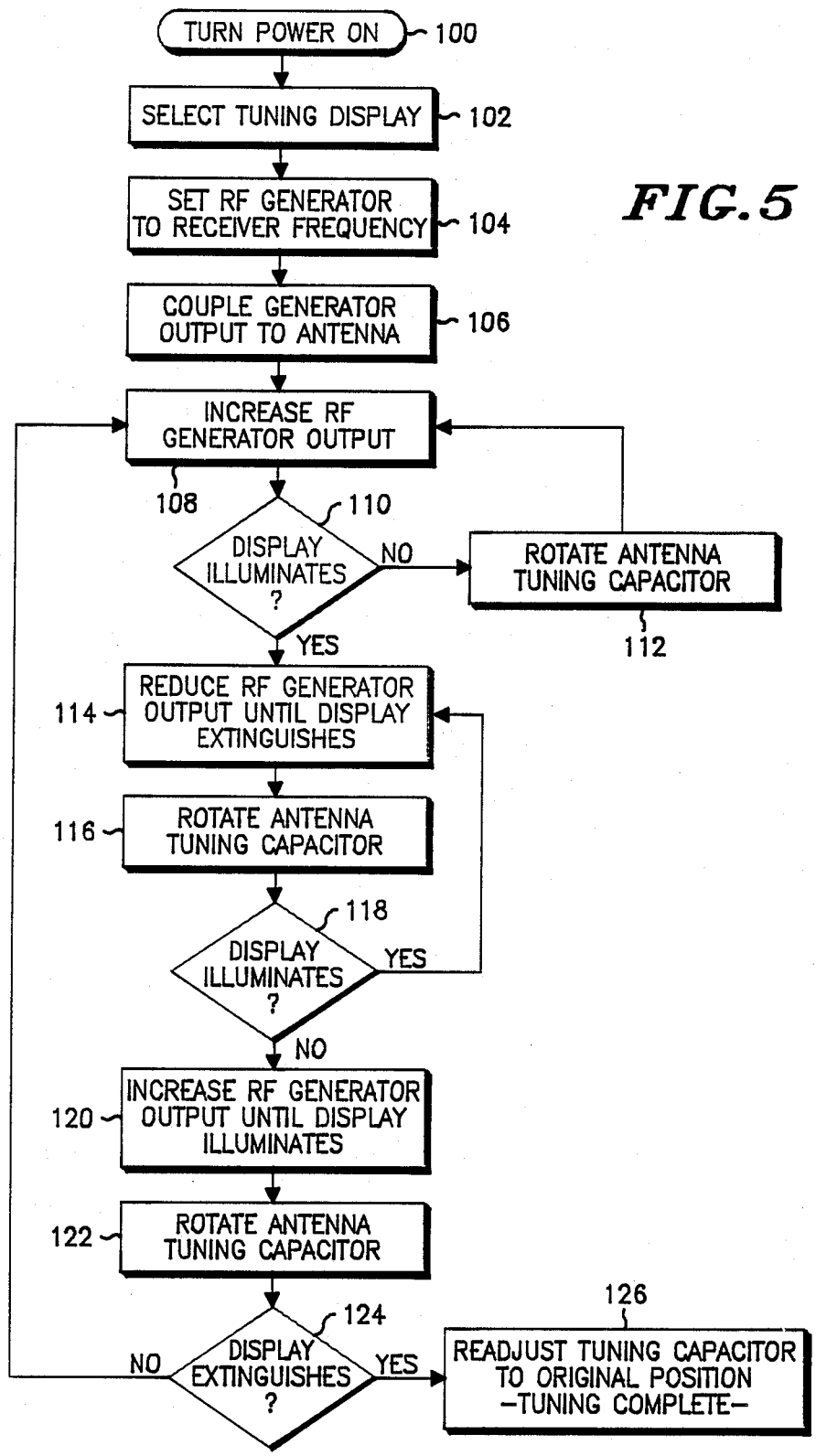
FIG. 5 is a flowchart describing the tuning procedure used for the preferred embodiment of the present invention.

Reference is now directed to FIG. 5 which shows the flowchart describing the antenna tuning procedure when a single tuning annunciator indicating a peak reading is provided, as described in the preferred embodiment of the present invention. After the pager-watch has been turned on as shown at block 100 by actuation of the "on" switch 162, actuation of tuning selector switch 74 activates tuning indicator operation, as shown at block 102, as previously described. An RF generator is set to the frequency of operation of the pager-watch to be tuned as shown at block 104, and the output of the RF generator is coupled to the antenna of the pager-watch as shown at block 106 in a manner to be described in detail later. The output of the RF generator is increased as shown at block 108, until tuning annunciator 168, to be described in detail later, illuminates, or otherwise indicates, as shown at block 110. If the tuning of antenna 14 is too far off to allow the RF generator output to be set at a reasonable level, such as from −80 to −100 dBm, tuning element 16 is rotated a fraction of a revolution to establish a closer tuning as shown at 112. When tuning annunciator 168 illuminates, as shown at block 110, either by increasing the output of the RF generator, or by increasing the output to a reasonable level and adjusting tuning element 16, the F generator output is reduced until tuning annunciator 168 extinguishes, as shown at block 114. Tuning element 16 is then adjusted as shown at block 116 until tuning annunciator 168 illuminates as shown at block 118. The RF generator output is then reduced as shown at block 114, and the procedure described in blocks 114 through 118 is repeated as often as required until tuning annunciator 168 no longer illuminates as shown in block 118 after tuning element 16 is adjusted.

At this time the RF generator output is increased until tuning annunciator 168 illuminates as shown in block 120. Tuning element 16 is then adjusted until tuning annunciator 168 extinguishes as shown in block 122. If tuning annunciator 168 fails to extinguish as shown at block 124, the procedure from block 108 through block 124 is repeated. If tuning annunciator 168 extinguishes, tuning element 16 is readjusted to the prior position at block 122 before final adjustment as shown at block 26, and the tuning procedure is completed.

While only antenna 14 is tuned by the procedure just described, other stages within the receiver could just as easily be tuned, although the use of a single element annunciator and a peak threshold detector would slow the process due to the number of iterations of the procedure which would be required to achieve tuning. This problem is solved by an alternate embodiment of the present invention which provides a more rapid procedure and also allows antenna 14 to be tuned without physical entry into case 20 as in the case of the preferred embodiment of the present invention.

Figure 6:
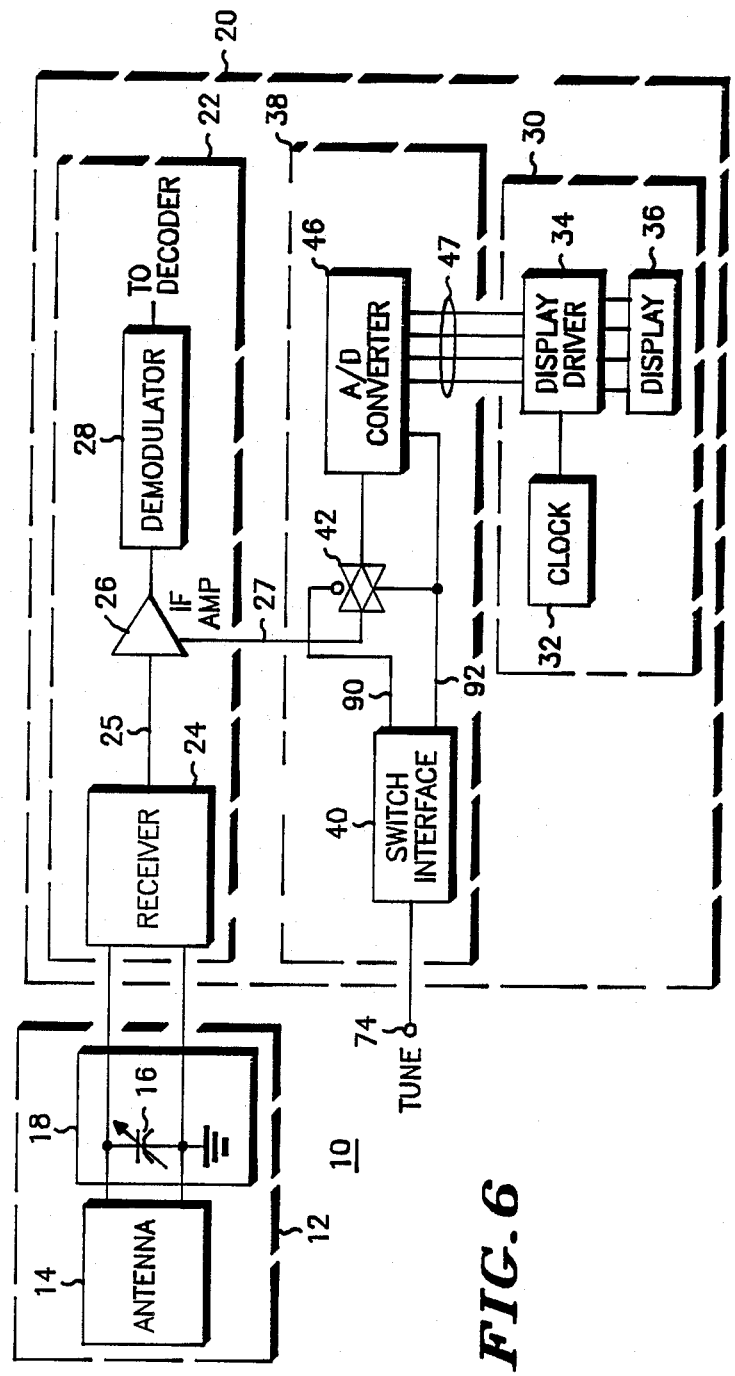
FIG. 6 is a functional block diagram of an alternate embodiment of the present invention.

Reference is now directed to FIG. 6 which shows an alternate embodiment of the present invention. The difference between the embodiment described in FIG. 1 and that shown in FIG. 6 is in the level detecting circuit of tuning indicator circuit 38. Unlike FIG. 1 which uses a single threshold peak level detector circuit 44, FIG. 6 uses a multiple-level peak detector circuit 46 having multiple outputs 47 for driving the display. The multiple-level peak detector circuit 46 may be better understood with reference now directed to FIG. 7 which shows the details of multiple-level peak detector circuit 46.

Figure 7:
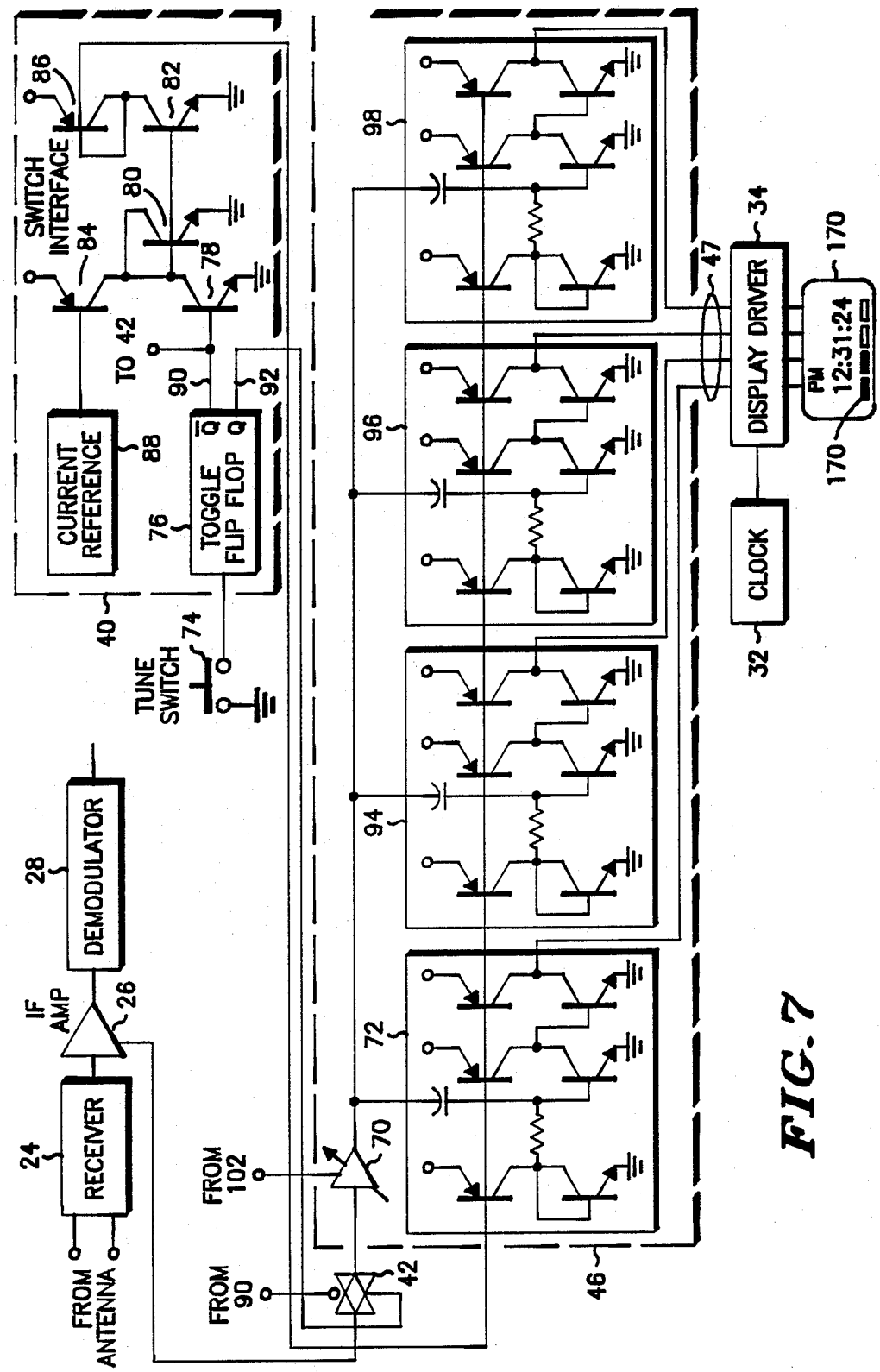
FIG. 7 is a more detailed electrical schematic diagram of the alternate embodiment of the present invention.

As shown in FIG. 7, the multiple-level peak detector circuit 46 is constructed of four individual peak detector circuits previously described in FIG. 4. Each of the individual peak detector circuits 72, 94, 96 and 98 are set to different threshold levels, such as a 2 dB difference between detectors 72 and 94, a 1 dB difference between detectors 94 and 96 and a 2 dB difference between detectors 96 and 98. In this manner, the results of tuning are visually displayed on a multi-segment tuning annunciator 170 to be described in greater detail later. Operation of the individual peak detector circuits shown in FIG. 7 is exactly as previously described, except that each peak detector circuit has a slightly different peak threshold voltage.

Figure 8:
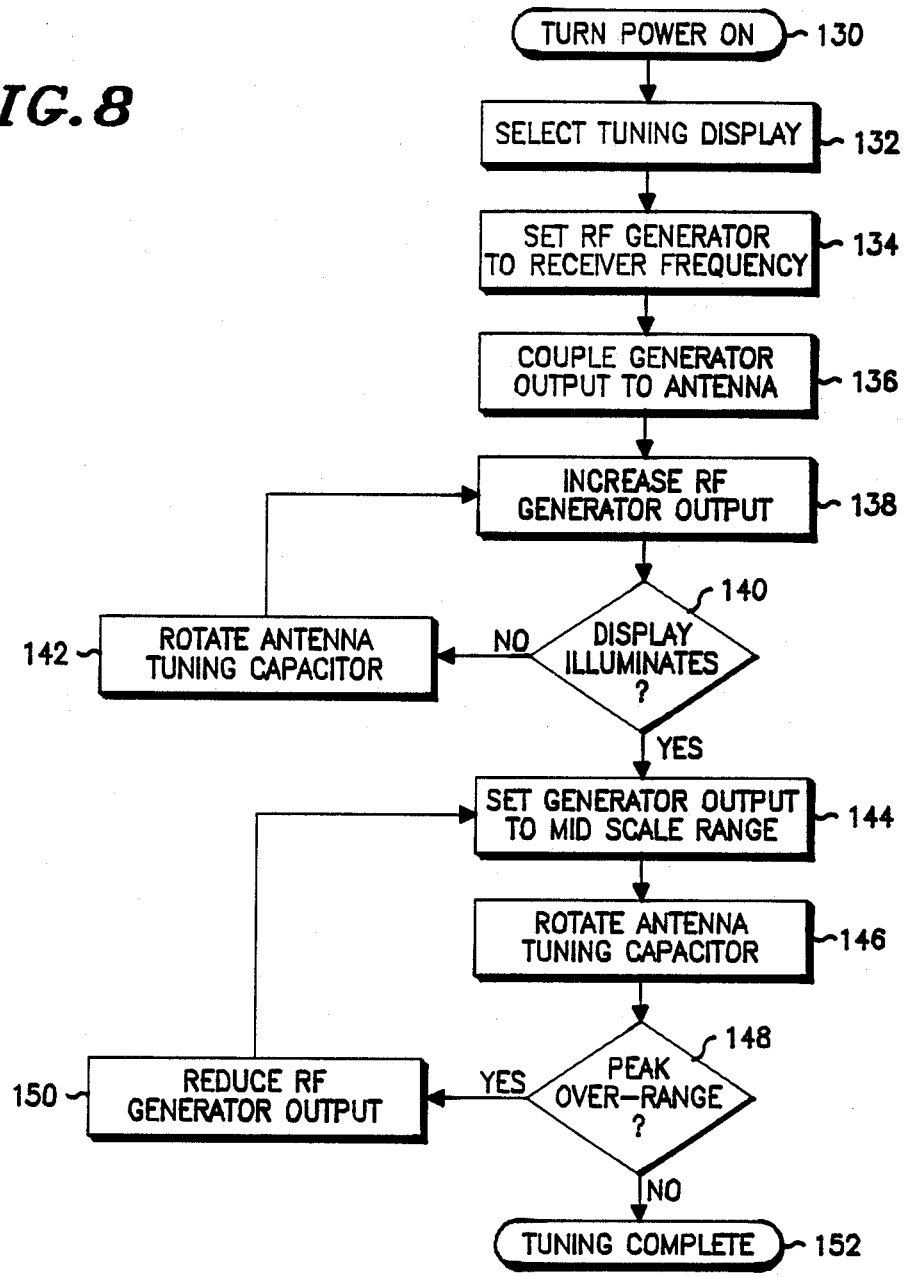
FIG. 8 is a flowchart describing the tuning procedure used for the alternate embodiment of the present invention.

Reference is now directed to FIG. 8 which shows a flowchart of the tuning procedure suitable for use with the multi-level peak detector circuit 46 described in FIG. 7. Power to the device is turned on as shown at block 130. Antenna tuning is selected by actuating tuning selector switch 74 as shown at block 132. The RF generator is set to the receiver frequency of the device to be tuned, as shown at block 134, and the output of the RF generator is coupled to the antenna of the device as shown at block 132. The output of the RF generator is increased until tuning annunciator 170 illuminates, or otherwise indicates, as shown at block 140. If tuning annunciator 170 does not illuminate at a suitable RF generator output level, as previously described, as shown at block 140, tuning element 16 is adjusted, and the procedures of blocks 138 and 140 are repeated until tuning annunciator 170 illuminates as shown at block 140. In the case of a tuning annunciator 170 having four segments as shown, the generator output is increased until two of the four segments are illuminated as shown at block 144, thus setting the RF generator to the midpoint of the tuning annunciator 170. Tuning element 16 is rotated and the results of tuning are noted on tuning annunciator 170. If all four segments of the tuning annunciator 170 are illuminated, indicating an over-range condition, the output of the RF generator is reduced, as shown at block 150, and the procedure of blocks 144 through 148 are repeated. If tuning element 16 can be adjusted so as to show a peak between the second and third annunciator segments, tuning is complete as shown at block 152.

Figure 9A:
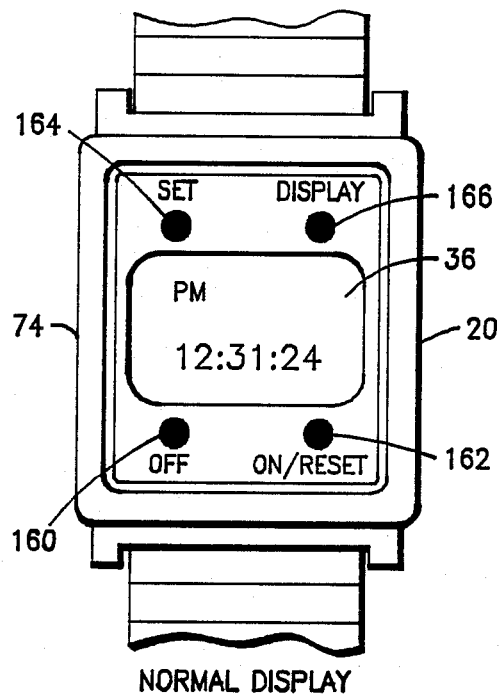
FIGS. 9A through 9D are pictorial diagrams describing alternate embodiments for the tuning indicator of the present invention combined with a time display.
Figure 9B:
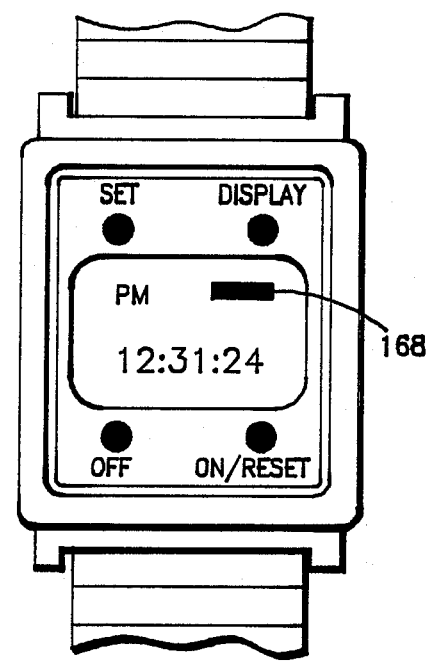

Reference is now directed to FIGS. 9A through 9D which show pictorial diagrams of the preferred embodiment of the miniature personal communications device 10, which in this case shows a pager-watch display. FIG. 9A shows a normal watch display 36 consisting of time and AM/PM graphics 158. It will be appreciated by one skilled in the art that other arrangements to display time and other information together with the tuning indication may be employed without departing from the scope or spirit of the present invention. In the preferred embodiment of the present invention described, the miniature personal communications device employs electronic controls 160 and 162, for controlling power to receiver 22 of the device. Such an arrangement allows the user of the device to turn off the receiver portion in the evening, if the user so desires, using "off" switch 160, and turning power on to the receiver portion of the device using "on/reset" switch 162. In this manner, energy from the internal battery is conserved, when the paging function is not required by the user. Two additional switches, "set" switch 164 and "display" switch 166 may be used to set and display time in a manner well known in the art for controlling the display of multifunction watch displays. Time information is displayed on display 36 in a well known fashion. A "tune" switch 74 is located on the side of watch case 20 (not shown) to control selection of the tuning feature previously described. "Tune" switch 74 is recessed to prevent accidental actuation while the pager-watch is being worn.

Reference is now directed to FIG. 9B which shows an example of a single segment annunciator 168 suitable for indicating tuning with a single threshold peak detector 44, as previously described. Tuning annunciator 168 is generally not visible until tuning has been selected and the threshold level of the level detector has been exceeded as previously described.

Figure 9C:
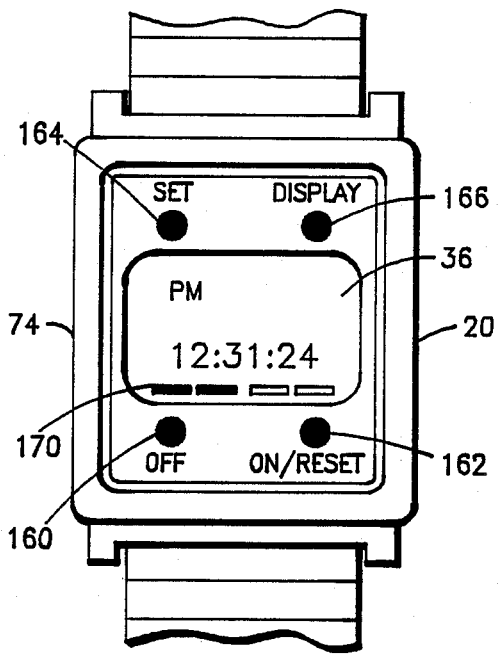

Reference is now directed to FIG. 9C which shows an example of a multi-segment tuning annunciator 170 which may be employed with a multiple-level peak detector 64, as previously described. Tuning annunciator 170 also is generally not visible until tuning has been selected and the threshold levels of the individual level detectors have been exceeded as previously described.

Figure 9D:
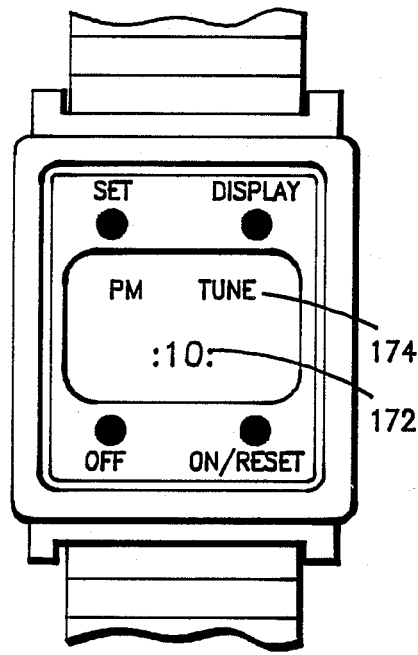

Reference is now directed to FIG. 9D which shows an another embodiment of the present invention wherein tuning annunciator 172 may actually employ some of the segments or digits normally used in the time display. Such an annunciator, when used with a more complex A/D converter circuit can provide substantially better resolution by displaying a number, such as "10" as shown as the midpoint of the level detector, and varying perhaps 10 steps around the midpoint, such as from 0 to 20. When the normal segments are used for the tuning annunciator, it would be appropriate to display an additional label 174, to indicate the tuning function is selected, as also shown in FIG. 9D. Other methods, such as flashing of the annunciator could also be employed to achieve the same result.

The usefulness of the single digit annunciator shown in FIG. 9B may be enhanced, if the display driver is able to work with a multiple inputs, and control such things as the contrast of the displayed segment. As tuning becomes closer, the contrast might increase, or if the display is allowed to flash when detuned, the display flashing might reduce in frequency or become steady when tuning has been achieved. Use of displays which would provide a digital graphic equivalence of a multiple level display similar to that provided by an analog meter would also be suitable as well.

Figure 10:
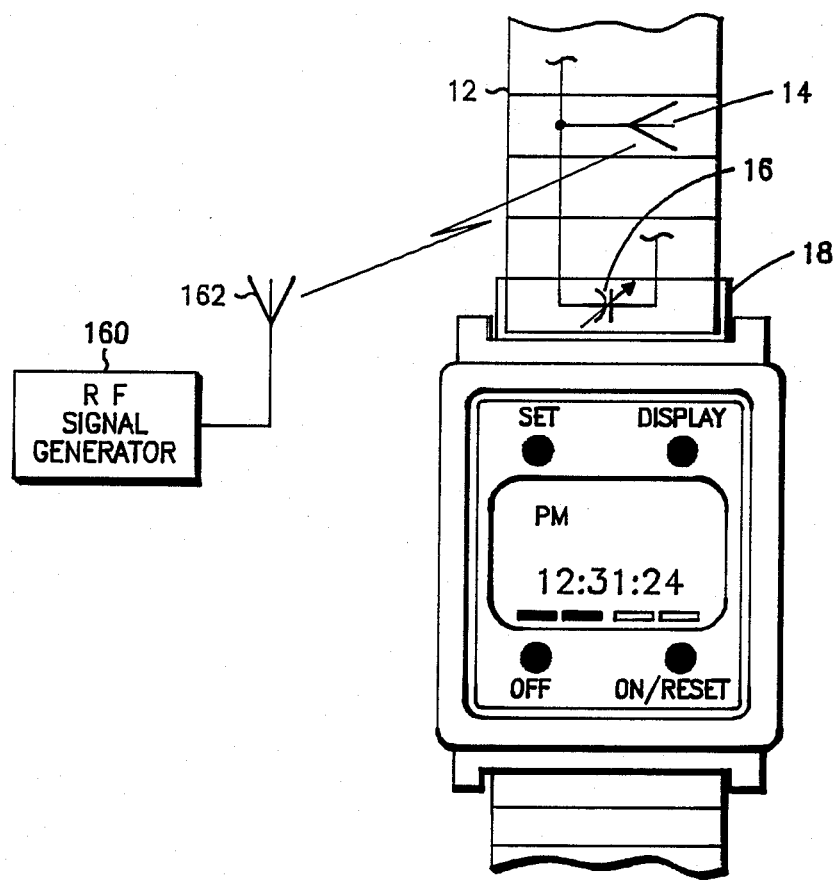
FIG. 10 is a pictorial diagram showing the equipment setup used to tune the antenna of the present invention.

Reference is now directed to FIG. 10 which shows in detail the setup used to tune the antenna of the miniature personal communications device, such as a pager-watch. In the preferred embodiment of the present invention, the device is positioned on the body as would normally be worn, and secured in place. A small antenna 162 provided to deliver an unmodulated carrier signal from RF generator 160, would be located near antenna 14, being secured in place on the users wrist by means such as a velcro strap, while the tuning is being completed in the case of a pager-watch. It will be appreciated by one skilled in the art that a modulated signal could have also been used for tuning, such a normally occurring on a busy communications or paging channel, without effecting the outcome of the tuning. Depending upon the level of complexity of the tuning annunciator provided, tuning element 16 is exposed by opening the cover to compartment 18 concealing tuning element 16 during normal wear. After tuning is completed, the cover is closed, and tuning antenna 162 is removed from the wrist.

We claim:

1. An antenna tuning arrangement for a portable communications device having a receiver for receiving transmitted signals, said arrangement comprising:
    a wristband connected to the device for adapting the device to be worn on the body, said wristband including
    antenna means for intercepting the transmitted signals,
    antenna tuning means, coupled to said antenna means, for tuning said antenna means,
    means for concealment of said antenna tuning means when tuning of said antenna means is not required;
    receiver means, responsive to said antenna means, for receiving the transmitted signals, said receiver means deriving tuning signals in response to said antenna tuning means being adjusted when the transmitted signals are received; and
    tuning indicator means responsive to the tuning signals, for providing a tuning indication corresponding to the tuning signals.

2. The antenna tuning arrangement according to claim 1 wherein said wristband with said antenna means, said antenna tuning means and said concealment means are removeable from the device.

3. The antenna tuning arrangement according to claim 1 wherein said tuning indicator means further comprises:
    selector means coupled to said receiver means for controlling the selection of the tuning signals;
    amplifier means, coupled to said selector means, for amplifying the tuning signals;
    annunciator means; and
    tuning detector means coupled to said amplifier means for detecting the magnitude of the amplified tuning signals, said tuning detector means further coupled to said annunciator means for providing an indication corresponding to the magnitude of the tuning signals.

4. The antenna tuning arrangement according to claim 3 wherein said annunciator means is visual.

5. The antenna tuning arrangement according to claim 4 wherein said visual annunciator means is a display.

6. The antenna tuning arrangement according to claim 5 wherein said display provides a graphic display corresponding to the magnitude of the tuning signals.

7. The antenna tuning arrangement according to claim 5 wherein said display provides a numeric indication corresponding to the magnitude of the tuning signals.

8. The antenna tuning arrangement according to claim 5 wherein said selector means further controls the supply of power to said tuning detector means.

9. The antenna tuning arrangement according to claim 8 wherein said selector means further comprising:
    switch means;
    signal isolation means coupled to said receiver means and to said tuning detector means for controlling the delivery of tuning signals; and
    latch means responsive to said switch means and coupled to said signal isolation means for effecting the selection of the tuning signals and for controlling power to said tuning detector means.

10. An antenna tuning arrangement for a wrist worn communications device having a receiver for receiving transmitted signals combined with a circuit for generating and displaying time, said arrangement comprising:
    means for generating time and means for displaying the same;
    a wristband connected to the device for adapting the device to be worn on the body said wristband including,
    antenna means for intercepting the transmitted signals,
    antenna tuning means, coupled to said antenna means, for tuning said antenna means, and
    means for concealment of said antenna tuning means, when tuning of said antenna means is not required;
    receiver means, responsive to said antenna means, for receiving the transmitted signals, said receiver means deriving tuning signals in response to said antenna tuning means being adjusted when the transmitted signals are received;
    selector means coupled to said receiver means for controlling the selection of the tuning signals;

amplifier means, coupled to said tuning selector means, for amplifying the tuning signals; and tuning detector means coupled to said amplifier means for detecting the magnitude of the amplified tuning signals, said tuning detector means further coupled to said display means for effecting the display of indicia indicating the magnitude of the tuning signals.

11. The antenna tuning arrangement according to claim 10 wherein the indicia displayed corresponding to the magnitude of the tuning signals is graphic and displayed independent of the time display.

12. The antenna tuning arrangement according to claim 10 wherein the indicia displayed corresponding to the magnitude of the tuning signals is numeric and displayed in place of the time display.

13. The antenna tuning arrangement according to claim 10 wherein said wristband with said antenna means, said antenna tuning means and said concealment means are removeable from the device.

14. The antenna tuning arrangement according to claim 10 wherein said selector means further controls the supply of power to said tuning detector means.

15. The antenna tuning arrangement according to claim 14 wherein said selector means further comprising:

switch means;

signal isolation means coupled to said receiver means and to said tuning detector means for controlling the delivery of tuning signals; and latch means responsive to said switch means and coupled to said signal isolation means for effecting the selection of the tuning signals and for controlling power to said tuning detector means.

16. The antenna tuning arrangement according to claim 1 wherein said tuning signal is derived from receiving an unmodulated frequency modulated (FM) carrier signal.

17. The antenna tuning arrangement according to claim 14 wherein the unmodulated carrier signal is an unmodulated frequency modulation (FM) signal.

18. The antenna tuning arrangement according to claim 10 wherein said tuning signal is derived from receiving an unmodulated frequency modulated (FM) carrier signal.

19. The antenna tuning arrangement according to claim 18 wherein the unmodulated carrier signal is an unmodulated frequency modulation (FM) signal.

* * * * *